US010303234B2

(12) United States Patent
Gailhard (10) Patent No.: US 10,303,234 B2
(45) Date of Patent: May 28, 2019

(54) METHOD AND DEVICE FOR CONTROLLING OPERATION OF THE POWER SUPPLY OF A PROCESSING UNIT BY MAKING A PERIODIC VOLTAGE COMPARISON

(71) Applicant: STMicroelectronics (Rousset) SAS, Rousset (FR)

(72) Inventor: Bruno Gailhard, Rognes (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 15/883,216

(22) Filed: Jan. 30, 2018

(65) Prior Publication Data

US 2018/0321727 A1    Nov. 8, 2018

(30) Foreign Application Priority Data

May 4, 2017 (FR) ...................... 17 53917

(51) Int. Cl.
| | |
|---|---|
| G06F 1/28 | (2006.01) |
| H02H 3/24 | (2006.01) |
| H03K 5/08 | (2006.01) |
| G01R 19/165 | (2006.01) |
| H02H 1/06 | (2006.01) |
| H02H 3/05 | (2006.01) |
| H02H 3/247 | (2006.01) |
| H02M 1/00 | (2006.01) |

(52) U.S. Cl.
CPC ......... *G06F 1/28* (2013.01); *G01R 19/16552* (2013.01); *H02H 1/06* (2013.01); *H02H 3/05* (2013.01); *H02H 3/24* (2013.01); *H02H 3/247* (2013.01); *H03K 5/082* (2013.01); *H02M 2001/0006* (2013.01)

(58) Field of Classification Search
CPC .............. G06F 1/28; G06F 1/30; G06F 1/305; G06F 1/24; G06F 1/324; H02H 3/243
See application file for complete search history.

(56) References Cited

U.S. PATENT DOCUMENTS

| | | | |
|---|---|---|---|
| 6,748,546 B1 * | 6/2004 | Mirov ....................... | G06F 1/08 713/320 |
| 6,819,150 B1 * | 11/2004 | Santosa .................... | G06F 1/08 327/141 |

(Continued)

OTHER PUBLICATIONS

INPI Search Report and Written Opinion for FR 1753917 dated Jan. 17, 2018 (6 pages).

*Primary Examiner* — Harry R Behm (74) *Attorney, Agent, or Firm* — Crowe & Dunlevy (57) ABSTRACT

An integrated processing unit is supplied by a power supply voltage present at the terminals of a capacitor configured to supply a maximum permissible voltage drop. A periodic pulse signal is generated having a period that is less than or equal to a current period determined from the maximum permissible voltage drop and a current consumption of the processing unit. The power supply voltage is compared with a threshold voltage at the pulse rate of the periodic pulse signal. A control signal generated from that comparison is delivered to the processing unit and has a first value when the power supply voltage is greater than or equal to the threshold voltage and a second value when the power supply voltage is less than the threshold voltage.

6 Claims, 4 Drawing Sheets

(56) References Cited

U.S. PATENT DOCUMENTS

| | | | |
|---|---|---|---|
| 2003/0041234 A1* | 2/2003 | Ishikawa | G06F 1/24 |
| | | | 713/1 |
| 2006/0086623 A1* | 4/2006 | Narula | G01N 27/26 |
| | | | 205/775 |
| 2006/0158808 A1 | 7/2006 | Scheikl et al. | |
| 2008/0278133 A1 | 11/2008 | Lee | |
| 2015/0039913 A1* | 2/2015 | Sugiyama | G06F 1/28 |
| | | | 713/300 |
| 2016/0062389 A1 | 3/2016 | Chang | |

* cited by examiner

METHOD AND DEVICE FOR CONTROLLING OPERATION OF THE POWER SUPPLY OF A PROCESSING UNIT BY MAKING A PERIODIC VOLTAGE COMPARISON

PRIORITY CLAIM

This application claims the priority benefit of French Application for Patent No. 1753917, filed on May 4, 2017, the disclosure of which is hereby incorporated by reference in its entirety to the maximum extent allowable by law.

TECHNICAL FIELD

The implementations and embodiments herein relate to electronic circuits, notably those comprising one or more processing units, and in particular controlling the power supply of such a processing unit.

BACKGROUND

In electronic circuits, the processing units are usually supplied by a power supply voltage at the terminals of a capacitor.

However, there is a critical voltage threshold below which the processing unit will no longer be able to operate correctly. For example, it is possible that in case of failure of the power supply the processing unit is only supplied by the capacitor which discharges more or less quickly according to the consumption of the processing unit, and therefore the voltage drops below the threshold.

It is therefore advisable to switch off or reinitialize the processing unit before this threshold is reached, in order, for example, to avoid a loss of information or damage to the processing unit.

There are solutions for monitoring the power supply voltage of a processing unit, and for switching off or reinitializing the processing unit on detecting a threshold voltage. However, these solutions have a significant current consumption, which may be problematic in applications that require both monitoring the power supply voltage and low current consumption.

SUMMARY

In an implementation, a method is provided for monitoring the power supply of a processing unit, e.g. a microcontroller, in order to switch off or reinitialize said microcontroller when the power supply reaches a threshold, by limiting the current consumption due to this monitoring.

According to one aspect, a method is provided for controlling the operation of an integrated processing unit supplied by a power supply voltage present at the terminals of a capacitor, in which: a maximum permissible voltage drop at the terminals of the capacitor is defined, a periodic pulse signal is generated the period of which is less than or equal to a current period determined from said maximum permissible voltage drop and a current consumption of the processing unit, said power supply voltage is compared with a threshold voltage at the pulse rate of the periodic pulse signal, and a control signal having a first value is delivered to the processing unit when the power supply voltage is greater than or equal to the threshold voltage and a second value when the power supply voltage is less than the threshold voltage.

Thus, by comparing the power supply voltage at the pulse rate of the pulse signal and not continuously, the current consumption of the control method is greatly reduced.

The maximum permissible voltage drop may be selected less than the difference between the threshold voltage and a critical voltage less than the threshold voltage.

Advantageously this makes it possible to avoid the power supply voltage from falling below the critical voltage between two pulses of the pulse signal, and therefore the comparison being performed too late.

According to one embodiment, the comparison of the power supply voltage with the threshold voltage includes a division of the power supply voltage by a division factor and a comparison of the divided voltage with a reference voltage equal to the threshold voltage divided by said division factor.

This notably makes it possible to compare the divided voltage with a more stable reference voltage, e.g. a bandgap voltage generated in a manner well known to the person skilled in the art.

According to one embodiment, the control signal is generated after a time period following the occurrence of each pulse of the pulse signal.

The processing unit may be configured for operating according to different operating modes respectively associated with different current consumptions of the processing unit, and the current period of the pulse signal may be adjusted according to the current operating mode of the processing unit.

The current period of the pulse signal may be adjusted according to the temperature and the leakage currents of the processing unit.

According to one embodiment, the processing unit is provided with a real-time clock signal and the period of the pulse signal is compared with the period of the real-time clock signal, and the shorter of the two periods is retained for the pulse signal.

According to another aspect, a device is provided for controlling the operation of an integrated processing unit, including: a power supply terminal intended to be connected to a power supply input of the processing unit, a capacitor connected to the power supply terminal, a pulse generating circuit configured to generate a periodic pulse signal the period of which is less than or equal to a current period determined from a maximum permissible voltage drop at the terminals of the capacitor and a current consumption of the processing unit, a comparison circuit configured to compare a power supply voltage present at the power supply terminal with a threshold voltage at the pulse rate of the periodic pulse signal, and deliver a control signal having a first value to the processing unit when the power supply voltage is greater than or equal to the threshold voltage and having a second value when the power supply voltage is less than the threshold voltage.

The period of the pulse signal may be equal to the current period or be less than the current period on condition that the consumption of the control device remains negligible compared with the consumption of the processing unit.

The maximum permissible voltage drop may be less than the difference between the threshold voltage and a critical voltage less than the threshold voltage.

The comparison circuit may include a voltage divider configured for dividing the power supply voltage by a division factor and a comparator configured for comparing the divided voltage with a reference voltage equal to the threshold voltage divided by said division factor.

The comparison circuit may be configured to deliver the control signal after a time period following the occurrence of each pulse of the pulse signal.

This time period notably corresponds to a period of initialization of the voltage divider, in order to avoid generating a control signal having an erroneous value, e.g. if said value was generated during the initialization of the voltage divider.

According to one embodiment, the processing unit is configured to operate according to a plurality of different operating modes respectively associated with different current consumptions of the processing unit, and the pulse generating circuit is configured to adjust the current period of the pulse signal according to the current operating mode of the processing unit.

The pulse generating circuit may be configured to adjust the current period of the pulse signal according to the temperature and therefore the leakage currents of the processing unit.

The processing unit may be configured for receiving a real-time clock signal and comprises a comparison circuit configured to compare the period of the pulse signal with the period of the real-time clock signal and retain the shorter of the two periods for the pulse signal.

BRIEF DESCRIPTION OF THE DRAWINGS

Other advantages and features of the invention will appear on examination of the detailed description of implementations and embodiments of the invention, in no way restrictive, and the attached drawings in which.

DETAILED DESCRIPTION

Figure 1:
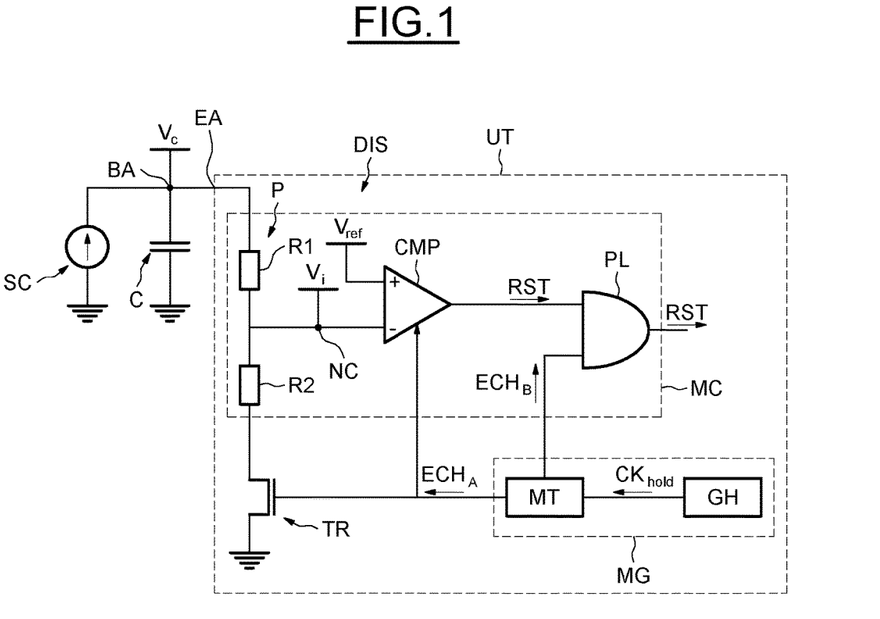
FIG. 1 is a schematic representation of a processing unit.

FIG. 1 is a schematic representation from an electrical point of view of a processing unit UT, e.g. a microcontroller, comprising a power supply input EA coupled to a power supply terminal BA of a current source SC.

A capacitor C is coupled between the power supply terminal BA and a ground node, and notably makes it possible to smooth the voltage variations at the terminals of the processing unit UT.

The processing unit UT here comprises a circuit device DIS configured for managing the consequences of an interruption in the power supply voltage and typically preventing the processing unit UT from operating when its power supply voltage is less than or equal to a critical voltage $V_{critical}$ too low for allowing correct operation.

Indeed, in the event of a failure of the current source SC, the processing unit UT may only be supplied by the capacitor C which progressively discharges notably according to the current consumption of the processing unit. It is therefore advisable to switch off the processing unit before the power supply voltage, here the voltage $V_c$ at the terminals of the capacitor, reaches the critical voltage $V_{critical}$.

By way of example, the power supply voltage $V_c$ is equal to three volts, the capacitance $C_1$ of the capacitor C is equal to ten microfarads, and the critical voltage $V_{critical}$ is of the order of 1.6 volts.

The device DIS includes a comparison circuit MC, configured for comparing the power supply voltage with a threshold value $V_{threshold}$ greater than the critical value $V_{critical}$, and as long as the power supply voltage $V_c$ is greater than or equal to the threshold value $V_{threshold}$, generating a control signal RST having a first value, e.g. a low logic state, intended for the processing unit UT. If the power supply voltage becomes less than the threshold voltage, the control signal RST has a second value, e.g. a high logic state, leading to the processing unit UT, for example, stopping its operations or being reinitialized.

By way of example, the threshold voltage $V_{threshold}$ here is equal to 1.7 volts.

The difference between the threshold voltage $V_{threshold}$ and the critical voltage $V_{critical}$ corresponds to a margin of safety.

As will be seen in more detail below, the comparison with the threshold voltage is performed at the pulse rate of a periodic pulse signal $CK_{hold}$.

The comparison circuit MC here comprises a voltage divider P, here comprising two resistors R1, R2, mounted in series between the power supply input and the ground node.

The voltage divider P is configured for delivering an intermediate voltage $V_i$ at the common node NC to the two resistors R1 and R2, which is equal to the power supply voltage of the processing unit divided by a division factor, and is coupled to a first input of a comparator CMP.

The second input of the comparator CMP is configured for receiving a reference voltage $V_{ref}$ equal to the threshold voltage divided by said division factor.

This reference voltage may, for example, be a bandgap voltage generated in a manner well known to the person skilled in the art.

It would, however, be possible for the power supply voltage of the processing unit UT to be directly compared with the threshold voltage $V_{threshold}$. However, the use of a bandgap voltage makes it possible to obtain a particularly stable reference voltage.

When the intermediate voltage $V_i$ is less than the reference voltage $V_{ref}$, i.e. when the power supply voltage $V_c$ is less than the threshold voltage $V_{threshold}$, the comparator CMP delivers the control signal RST having the second value at the input of an AND logic gate PL.

The logic gate PL comprises a second input configured for receiving an auxiliary pulse signal $ECH_B$ as it will be seen below, and when the second input of the logic gate PL is in the high state the logic value of the control signal RST is copied onto the output of the logic gate PL.

If the second input of the logic gate PL is in the low state, the control signal RST, delivered to the processing unit UT, has the first logic value, i.e. here zero.

The device DIS comprises a pulse generating circuit MG, here comprising a clock signal generator GH configured for delivering a periodic pulse signal $CK_{hold}$ having a current period T, and coupled to a timing circuit MT.

The timing circuit MT is configured for generating a first auxiliary pulse signal $ECH_A$ and the second auxiliary pulse signal $ECH_B$.

The generating circuit MG here is coupled to a transistor TR itself coupled between the second resistor R2 and the ground node, and the gate of which is configured to receive the auxiliary pulse signal $ECH_A$.

Figure 2:
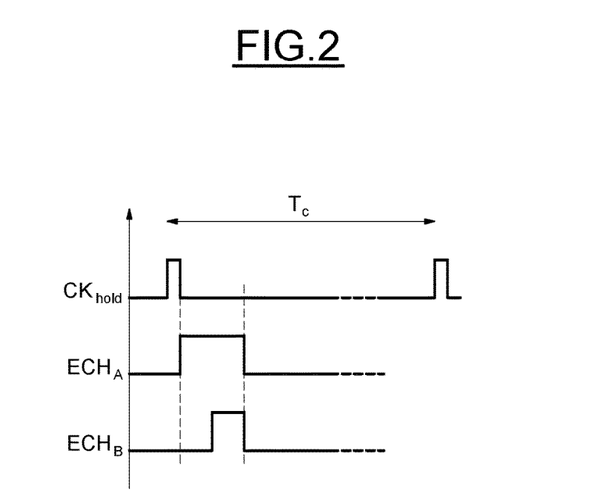
FIG. 2 is a waveform diagram.

As illustrated in FIG. 2, the timing circuit MT is configured, at the reception of a pulse of the pulse signal $CK_{hold}$, for generating a pulse of the first auxiliary signal $ECH_A$ of a first duration (e.g. of 30 microseconds) and for generating a pulse of the second auxiliary signal $ECH_B$ of a second duration (e.g. of fifteen microseconds) after expiration of a time period (e.g. of fifteen microseconds) following the generation of the first auxiliary pulse signal $ECH_A$.

The timing circuit MT is conventional and known per se, and may, for example, comprise a thirty-two kilohertz auxiliary clock generating pulses of thirty microseconds.

The first auxiliary signal $ECH_A$ here is configured, when it is in the high state, for polarizing the gate of the transistor TR and switching it on and for turning on (i.e., enabling operation of) the divider P and the comparator CMP.

The second auxiliary pulse signal $ECH_B$ here is configured, when it is in the high state, for activating the logic gate PL and therefore making it possible to deliver the logic value of the control signal RST.

The delay of fifteen microseconds with respect to the first auxiliary pulse signal corresponds to a duration of initialization of the voltage divider P and the comparator CMP, in order for the voltage $V_i$ at the common node NC to be stabilized.

The duration of this delay is advantageously defined according to the value of the resistors of the divider P and its associated capacitances, e.g. its parasitic capacitances.

Advantageously this makes it possible to avoid the generation of a control signal RST which would be, for example, generated while the voltage divider P and the comparator are not yet fully initialized, and therefore which would have an erroneous value.

Thus, the device DIS is configured for performing comparisons only in response to a pulse of the pulse signal $CK_{hold}$, which advantageously makes it possible to obtain a reduced current consumption compared with a device which would perform the same comparison continuously.

The current consumption $I_d$ of the device DIS may be defined by the equation $$I_d = (I_p + I_{cmp}) * \left(\frac{T_{ECHA}}{T_c}\right)$$

with $I_p$ the consumption of the voltage divider, $I_{cmp}$ the consumption of the comparator, $T_{ECHA}$ the duration of the pulse of the signal $ECH_A$, and $T_c$ the period of the pulse signal $CK_{hold}$.

As a variant, the comparator may only be turned on for the duration of the pulse of the signal $ECH_B$. It would thus be possible to dispense with the use of the logic gate PL.

In this case, the consumption $I_d$ of the device DIS may be defined by the equation:

$$I_d = (I_p) * \left(\frac{T_{ECHA}}{T_c}\right) + (I_{cmp}) * \left(\frac{T_{ECHB}}{T_c}\right)$$

with $T_{ECHB}$ being the duration of the pulse of the signal $ECH_B$.

However, it is advantageous, notably in terms of integration density, to design a comparator the consumption $I_{cmp}$ of which is very much lower than the consumption Ip of the voltage divider P. In this case, the difference in consumption between these two solutions is very small, or even negligible.

As mentioned before, if, during the comparison, the power supply voltage $V_c$ is less than the threshold voltage $V_{threshold}$, the comparison circuit MC generate the control signal RST having the second value intended for the processing unit UT which is then switched off.

However, it would be possible that during a pulse of the reference pulse signal $CK_{hold}$ the voltage $V_c$ is slightly greater than the threshold voltage $V_{threshold}$, and that the voltage drop at the terminals of the capacitor C is such that the voltage $V_c$ falls below the threshold voltage $V_{threshold}$ before the generation of the next pulse of the reference pulse signal $CK_{hold}$.

Therefore a maximum permissible voltage drop $\Delta v$ is defined at the terminals of the capacitor C. This maximum permissible voltage drop $\Delta v$ could in theory be equal to the difference between the threshold voltage $V_{threshold}$ and the critical voltage $V_{critical}$, but for obvious safety reasons, this voltage drop $\Delta v$ is advantageously selected to be less than the difference between the threshold voltage $V_{threshold}$ and the critical voltage $V_{critical}$. By way of example, the permissible voltage drop $\Delta v$ here is four millivolts.

The current period $T_c$ of the pulse signal $CK_{hold}$ is associated with this maximum permissible voltage $\Delta v$ defined according to the formula $$T_c = C_1 * \frac{\Delta v}{I_c};$$

with $C_1$ the capacitance of the capacitor C, $\Delta v$ the permissible voltage drop, and $I_c$ the current consumption of the processing unit.

Figure 3:
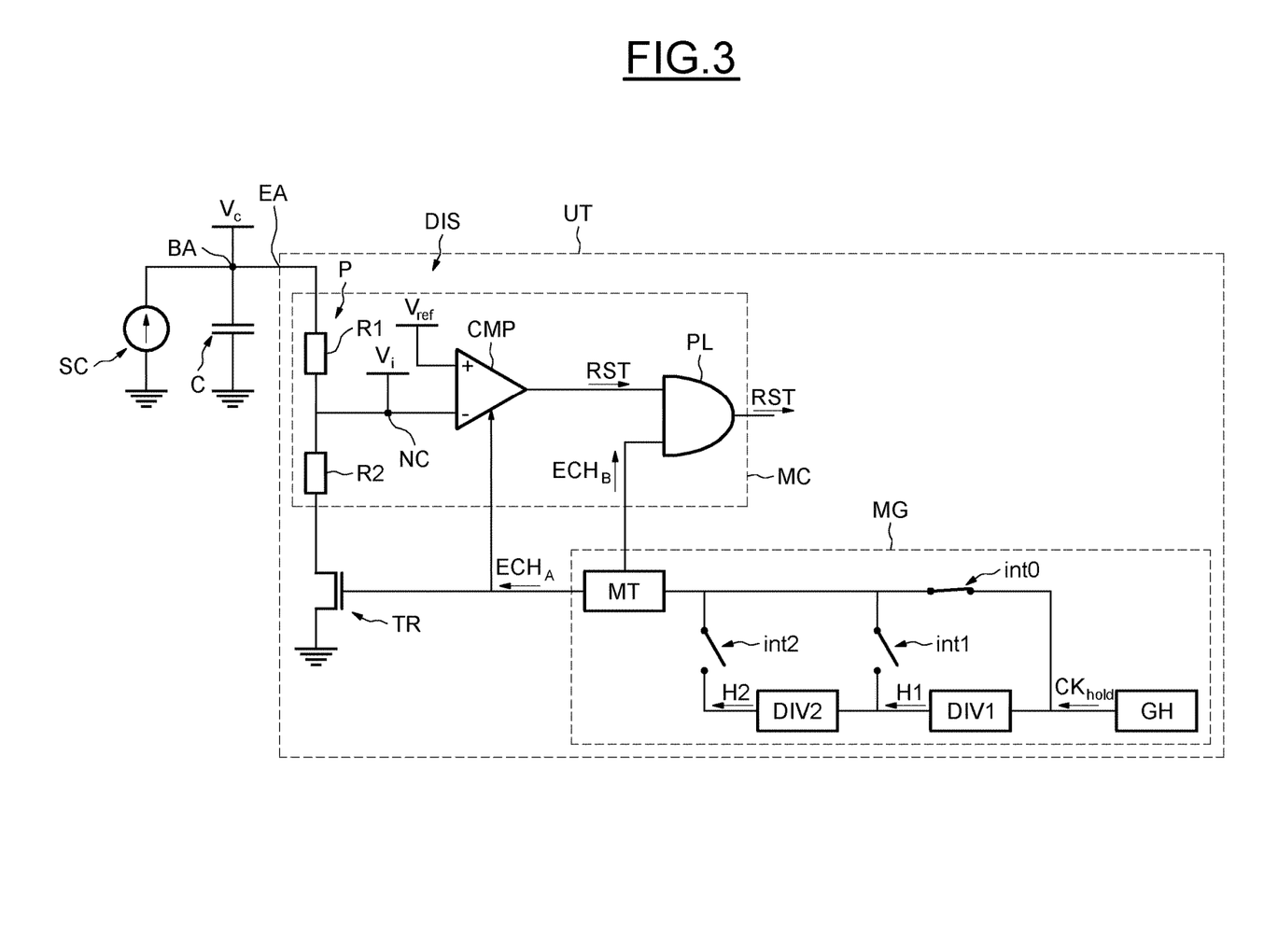
FIG. 3 is a schematic representation of a processing unit.

FIG. 3 illustrates an embodiment in which the processing unit UT is configured for operating according to three distinct operating modes, each distinct operating mode being associated with a distinct current consumption of the processing unit UT which may be determined, for example, by simulation.

For example, the processing unit UT may operate: according to a first operating mode leading to a high current consumption, here twenty microamperes, according to a second operating mode leading to an average current consumption, e.g. two microamperes, and in a standby mode leading to a low current consumption, e.g. one hundred nanoamperes.

In this embodiment, the generator GH of the pulse $CK_{hold}$ is coupled to the timing circuit MT via a first switch int0.

The pulse generating circuit MG includes a first frequency divider DIV1 connected to the timing circuit MT via a second switch int1, and a second frequency divider DIV2 connected to the timing circuit MT via a third switch int2 coupled between the generator GH and the timing circuit MT.

The switches int0, int1, and int2 are used to activate the frequency dividers DIV1 and DIV2 and here are schematically employed for simplification purposes. In practice the frequency dividers DIV1 and DIV2 may be activated by any type of activation circuitry.

The switches int0, int1 and int2 are, for example, controlled by the processing unit UT.

The first frequency divider DIV1 is configured for receiving the pulse signal $CK_{hold}$ and for delivering a first divided pulse signal H1 having a frequency equal to the frequency of the initial pulse signal $CK_{hold}$ divided by a first factor, e.g. here ten.

The second frequency divider DIV2 is configured for receiving the first divided pulse signal H1 and for delivering a second divided pulse signal H2 having a frequency equal to the frequency of the first divided pulse signal H1 divided by a second factor, e.g. twenty.

When the processing unit UT is in the first operating mode, the second switch int1 and the third switch int2 are open and the first switch int0 is closed. The dividers DIV1 and DIV2 are not active and the timing circuit MT receives the initial pulse signal $CK_{hold}$ having the period $T_c$.

When the processing unit is in its second operating mode, the first switch int0 and the third switch int2 are open and the second switch int1 is closed. Only the first divider DIV1 is activated, and the timing circuit MT receives the first divided pulse signal H1.

When the processing unit UT is in standby, the first switch int0 is open, and the second switch int1 and the third switch int2 are closed. The first divider DIV1 and the second divider DIV2 are activated and the timing circuit MT receives the second divided pulse signal H2, the frequency of which is equal to the frequency of the pulse signal $CK_{hold}$ divided by the product of the first factor by the second factor.

Thus, it is possible to adjust the frequency, and therefore the period of the pulse signal delivered to the timing circuit MT and at the pulse rate the comparison of which will be performed with the threshold voltage, according to the current consumption of the processing unit UT.

Here, the period associated with the first operating mode is two milliseconds, the period associated with the second operating mode is twenty milliseconds, and the period associated with the standby mode is four hundred milliseconds.

The current period of the pulse signal delivered to the timing circuit MT associated with each operating mode and determined as explained above is, in fact, a maximum value defined for a given Δv, e.g. 4 mV. However, for a given operating mode, e.g. the second mode, this current period (20 ms) could be retained as the period for another operating mode, e.g. the standby mode, which provides a longer current period (400 ms) on condition that in this other operating mode the average consumption of the monitoring device DIS for monitoring the power supply remains negligible compared with the current consumption of the processing unit UT. In this case at least some of the dividers could be dispensed with.

During the operation of the processing unit UT, leakage currents from the processing unit may lead to instability in the voltage $V_c$ at the terminals of the capacitor C, which would then be disconnected from the current source SC.

These leakage currents may correspond, for example, to leakage currents from the transistors of the processing unit UT and the P and N junctions of the components of the processing unit UT, and vary exponentially according to the temperature of the processing unit UT. Thus, these leakages are greater at high temperature, e.g. one hundred and twenty-five degrees Celsius, than at ambient temperature, typically twenty-five degrees Celsius.

Furthermore, according to the technological variations of the method of manufacture of the processing unit UT, the leakage currents of the N junctions of the components of the processing unit UT may be different from the leakage currents of the P junctions.

It is advisable then to take these leakage currents into account in the consumption of the processing unit UT in order to best adapt the period T of the periodic pulse signal $CK_{hold}$.

Figure 4:
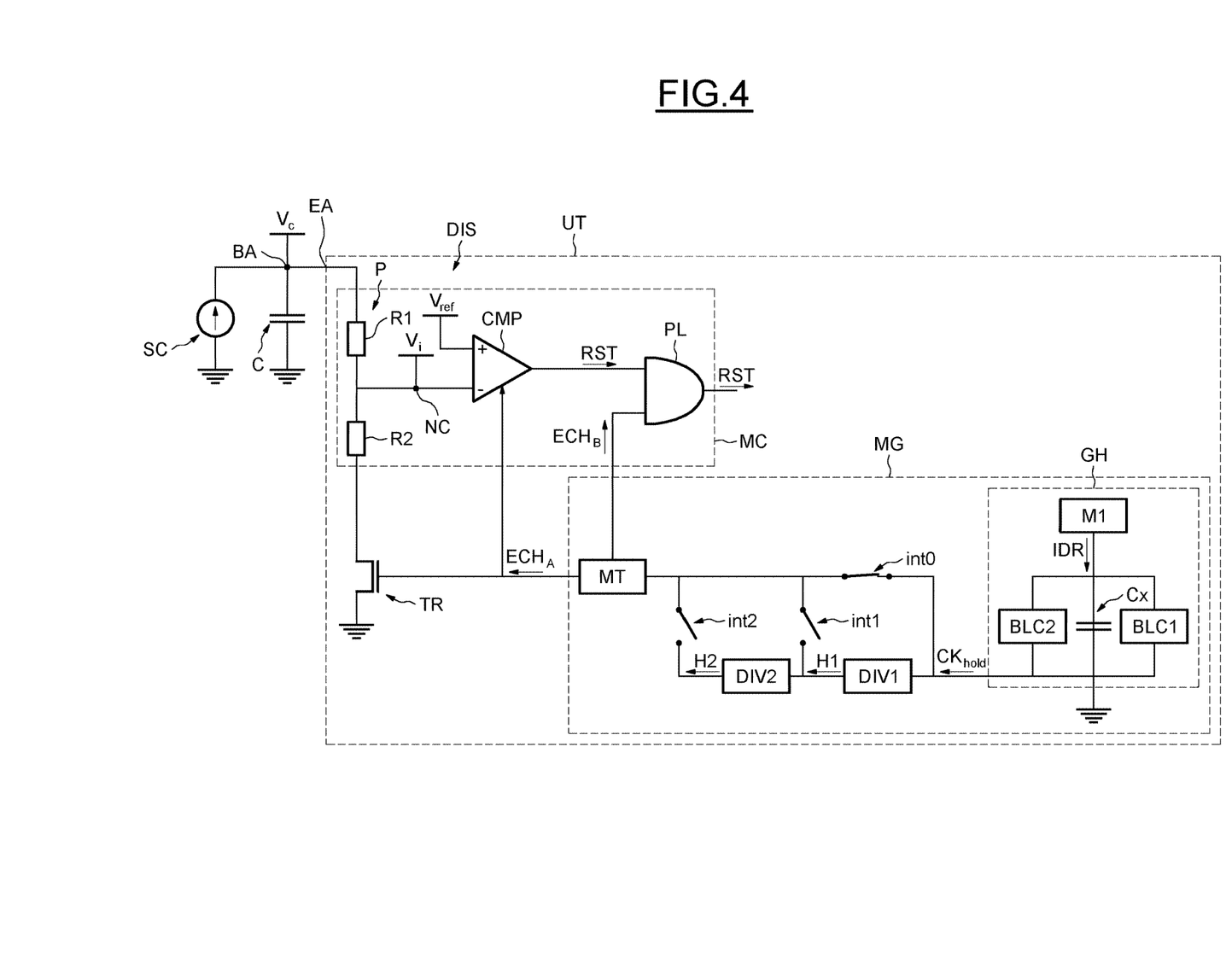
FIG. 4 is a schematic representation of a processing unit.

Thus, as illustrated in FIG. 4, the generator GH comprises a current generator circuit M1 configured for generating at least one main current IPR representative of at least one leakage current from the processing unit UT, and for delivering said at least one main current IPR to an auxiliary capacitor $C_x$ coupled between the circuit M1 and the ground node.

The circuit M1 may, for example, comprise a very large number of junctions in parallel.

A pulse generator circuit BLC1 coupled in parallel with the auxiliary capacitor $C_x$ is configured for generating a current pulse when the voltage at the terminals of the auxiliary capacitor $C_x$ reaches a certain threshold, and a discharge circuit BLC2 is configured for discharging the auxiliary capacitor $C_x$ at each generation of a pulse by the pulse generator circuit BLC1. In operation then, the greater the leakage currents, the higher the pulse frequency will be.

The pulses thus generated by the pulse generator circuit BLC1 here form the pulse signal $CK_{hold}$.

Thus, the higher the temperature of the processing unit UT, the greater the leakage currents and therefore the main current IPR will be, and the shorter the period of the initial pulse signal $CK_{hold}$.

The period of the reference pulse signal $CK_{hold}$ is therefore advantageously adapted according to the leakage currents of the processing unit which allows greater accuracy of the device DIS.

The circuitry for M1, BLC1, BLC2 and $C_x$ is, for example, more fully described in the French Patent Application Publication No. 3014266 (incorporated by reference), and the person skilled in the art will be able to refer to it for any useful purpose.

Figure 5:
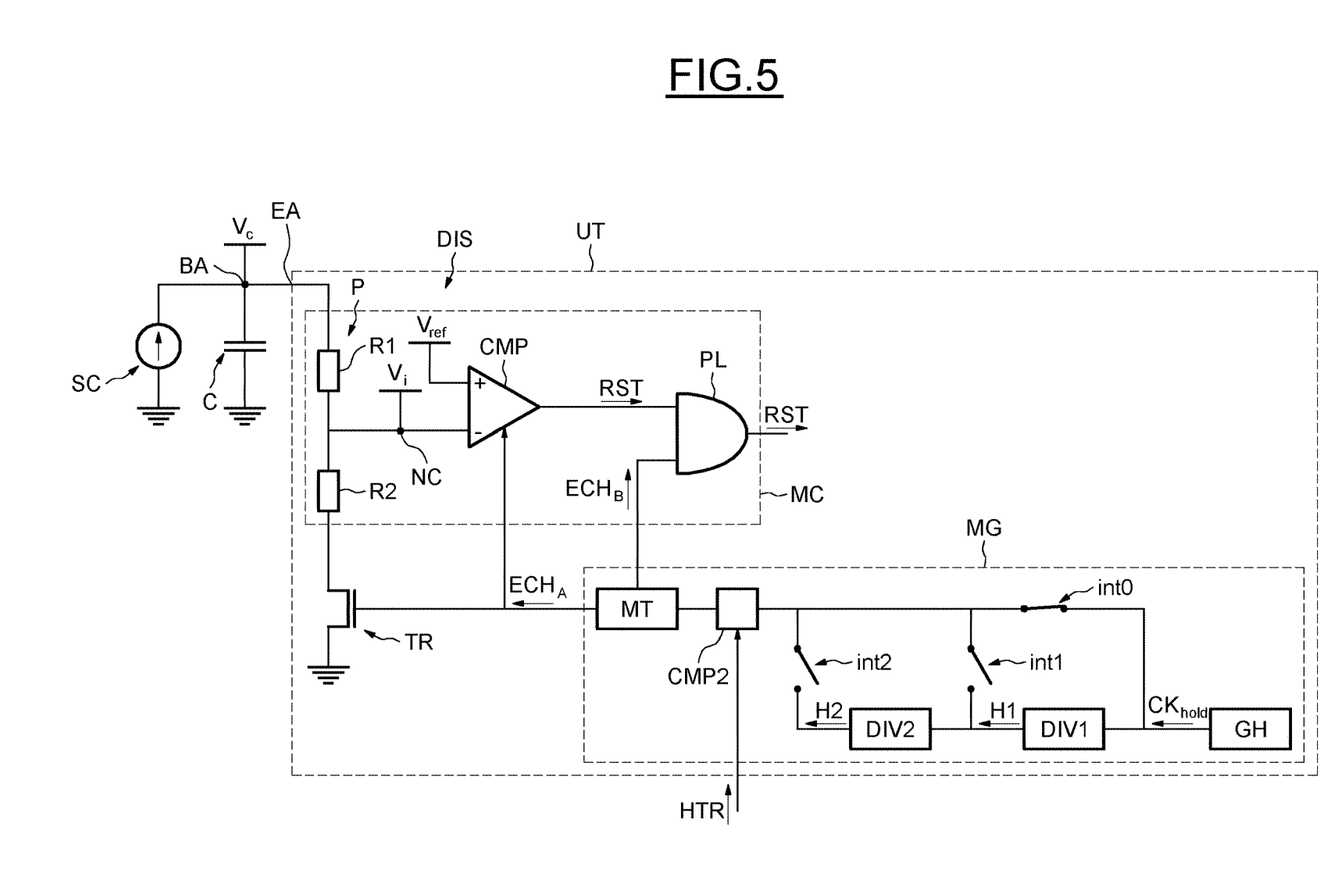
FIG. 5 is a schematic representation of a processing unit.

According to one embodiment illustrated in FIG. 5, the processing unit UT is configured for receiving a real-time clock signal HTR, conventionally allowing a precise measurement of time by the processing unit UT. The period of the signal HTR may vary according to the temperature.

The pulse generating circuit MG here comprises a comparison circuit CMP2, e.g. a second comparator or multiplexer, coupled between the pulse signal generator GH and the timing circuit MT, configured for receiving the periodic pulse signal $CK_{hold}$ or optionally the pulse signals H1 or H2 and the real-time clock signal HTR, and for delivering to the timing circuit a pulse signal the period of which is equal to the shortest period between that of the periodic pulse signal $CK_{hold}$ or optionally that of the signals H1 or H2 and that of the real-time clock signal HTR.

Advantageously this makes it possible to set a maximum period for timing the comparisons of the device DIS. In this case, the comparisons may be timed at a period of less than the current period $T_c$ of the periodic pulse signal $CK_{hold}$.

Although a description has previously been given in connection with FIGS. 1 to 5 of a device comprising the logic gate PL used to avoid generating the control signal RST having an erroneous value, it is possible to conceive of any other circuitry being used so as not to generate a control signal RST having an erroneous value, e.g. a latch, a multiplexer or a circuit integrated into the comparator CMP.

And although a description has been given in connection with FIG. 2 of timing circuit MT configured for generating a pulse of the first auxiliary signal $ECH_A$ and a pulse of the second auxiliary signal $ECH_B$ sharing the same time range, it would also be possible for the timing circuit MT to be configured for generating a pulse of a third auxiliary signal, having, for example, a duration of fifteen microseconds, a pulse of the second auxiliary signal $ECH_B$ generated on the falling edge of the pulse of the third signal, and a pulse of the first auxiliary signal $ECH_A$ which here would have a duration equal to the sum of the durations of the second and third auxiliary signals.

The invention claimed is:

1. A method for controlling the operation of an integrated processing unit supplied by a power supply voltage present at the terminals of a capacitor, in which a maximum permissible voltage drop at the terminals of the capacitor is defined, comprising:
   generating a current having a value that is representative of a leakage current within the integrated processing unit,
   generating a periodic pulse signal from said current, the periodic pulse signal having a frequency that is proportional to the value of said current,
   comparing said power supply voltage with a threshold voltage at a pulse rate of the periodic pulse signal, and
   generating a control signal for delivery to the processing unit having a first value when the power supply voltage is greater than or equal to the threshold voltage and having a second value when the power supply voltage is less than the threshold voltage.

2. The method according to claim 1, wherein comparing the power supply voltage with the threshold voltage includes dividing the power supply voltage by a division factor and comparing the divided voltage with a reference voltage equal to the threshold voltage divided by said division factor.

3. The method according to claim 1, further comprising generating the control signal after a time period following the occurrence of each pulse of the pulse signal.

4. A device for controlling the operation of an integrated processing unit including a power supply terminal intended to be connected to a power supply input of the power supply terminal, a capacitor connected to the power supply terminal, comprising:
   a current source configured to generate a current having a value that is representative of a leakage current within the integrated processing unit,
   a pulse generating circuit configured to generate a periodic pulse signal from said current, the periodic pulse signal having a frequency that is proportional to the value of said current,
   a comparison circuit configured to compare, at the pulse rate of the periodic pulse signal, a power supply voltage present at the power supply terminal with a threshold voltage and deliver a control signal to the processing unit having a first value when the power supply voltage is greater than or equal to the threshold voltage and having a second value when the power supply voltage is less than the threshold voltage.

5. The device according to claim 4, wherein the comparison circuit includes:
   a voltage divider configured to divide the power supply voltage by a division factor; and
   a comparator configured to compare the divided voltage with a reference voltage equal to the threshold voltage divided by said division factor.

6. The device according to claim 4, further comprising a delay circuit configured to delay delivery of the control signal from the comparison circuit until after a time period following the occurrence of each pulse of the pulse signal.

* * * * *